United States Patent [19]
Lychyk et al.

[11] Patent Number: 5,077,891
[45] Date of Patent: Jan. 7, 1992

[54] METHOD FOR RECONSTRUCTING THE CONDUCTOR TRACES OF A PRINTED CIRCUIT BOARD ASSEMBLY

[75] Inventors: George S. Lychyk, River Forest; Juzer Mohammed, Naperville, both of Ill.

[73] Assignee: AG Communication Systems Corporation, Phoenix, Ariz.

[21] Appl. No.: 516,841

[22] Filed: Apr. 30, 1990

[51] Int. Cl.$^5$ ............................................. H05K 3/02
[52] U.S. Cl. ....................................... 29/847; 29/846; 401/176; 427/96
[58] Field of Search .................. 29/846, 847, 402.01, 29/402.03, 402.09, 402.11, 402.18; 219/121.17; 427/96, 140, 54.1; 401/176

[56] References Cited

U.S. PATENT DOCUMENTS

| | | | |
|---|---|---|---|
| 2,959,498 | 11/1960 | Sweeny | 427/96 |
| 3,764,280 | 10/1973 | Lupinski | 427/96 X |
| 4,159,424 | 6/1979 | Suh et al. | 219/121.17 |
| 4,259,367 | 3/1981 | Dougherty, Jr. | 427/140 X |
| 4,405,249 | 9/1983 | Scales | 401/176 X |
| 4,683,652 | 8/1987 | Hatfield | 29/846 X |
| 4,694,138 | 9/1987 | Oodaira et al. | 29/846 X |
| 4,708,267 | 11/1987 | Sieverding et al. | 401/176 X |
| 4,762,732 | 8/1988 | Drake et al. | 427/54.1 |
| 4,863,757 | 9/1989 | Durand | 427/96 X |

Primary Examiner—Carl J. Arbes
Attorney, Agent, or Firm—Gregory G. Hendricks

[57] ABSTRACT

A first method repairs the conductor traces of a printed circuit board assembly and includes the steps of first locating and isolating a break in an existing conductor trace. After the brake is isolated, an extrusion of a conductive resin material is applied, utilizing an extrusion delivery system. The conductive resin is then cured, hardening the conductive resin. A second method reworks the conductor traces of the printed circuit board assembly. This method severs an existing conductor path between existing electrical elements on the printed circuit board assembly and builds a conductor path to form a new connection. The method includes the steps of severing the conductor trace extending between the leads of a first and a second electrical element. Next, utilizing an extrusion delivery system, a conductive resin is extruded onto the printed circuit board assembly between the lead of the first electrical element and the lead of a third electrical element. Finally, the conductive resin is cured, thereby, hardening and fixing the conductive resin to the printed circuit board assembly.

2 Claims, 1 Drawing Sheet

METHOD FOR RECONSTRUCTING THE CONDUCTOR TRACES OF A PRINTED CIRCUIT BOARD ASSEMBLY

BACKGROUND OF THE INVENTION

1. Field of the Invention

The present invention relates in general to the field of printed circuit board assemblies and, more particularly, to a new and improved method for repairing and/or reworking the conductor traces of a printed circuit board assembly.

2. Description of the Prior Art

The repair and/or rework of Printed Circuit Board Assemblies (PCBA) is currently performed by mechanically modifying the existing conductor traces found on the PCBA and manually establishing new conductor traces. In the repair of a PCBA conductor, a damaged or severed conductor trace is repaired by bridging the damaged conductor trace with solder. When the trace has sufficient width the repair can be made by soldering a wire conductor across the damaged conductor trace. In the rework of a PCBA, such as when a conductive path from one PCBA mounted component to the another PCBA component is changed for engineering purposes, the existing trace is cut causing a break in the conductive path. Then a wire conductor is manually soldered between the component leads to make the desired new connection. If the repair or rework is very extensive, a new artwork is generated, incorporating all of the repair/rework changes, and a new PCBA is manufactured.

Manual repair and/or rework of a PCBA is a very cumbersome and labor intensive process. It is not unusual to have over 40 man hours of labor expended in the repair and/or rework of a single PCBA. Additionally, the long term reliability of a reconstructed PCBA suffers due to the quality of the repair. For example, poor solder connections may cause intermittent signal loss or may break and fail. Conductor wires routed from one component to the another may be damaged from handling of the PCBA leading to the failure of the connections.

The current invention solves these aforementioned problems by providing a method for repairing and/or reworking a PCBA by extruding a conductive resin between the required new connection points. The present invention eliminates the manual soldering of wire conductors as a repair and/or rework medium, thereby, reducing the time and effort needed to effect the change.

Accordingly, it is the object of the present invention to disclose a new and improved method for repairing and/or reworking the conductor traces of a PCBA by extruding a conductive resin between the required new connection points.

SUMMARY OF THE INVENTION

The above and other objects, advantages, and capabilities are realized in a method for repairing and/or reworking the conductor traces of a printed circuit board assembly. The method of repairing a conductor trace includes the steps of first locating and isolating a break in an existing conductor trace. After the break is isolated, an extrusion delivery system is utilized to apply an extrusion of a conductive resin material, bridging the break. The conductive resin is then cured, thereby, hardening and fixing the conductive resin and providing a conductive path across the break.

In reworking the conductor traces of a printed circuit board assembly, the method contemplates the severing of an existing conductor path between the leads of a first and second electrical element, and the application of a conductor trace between the lead of the first electrical element and the lead of a third electrical element. The method includes the steps of severing the conductor trace extending between the leads of the first and the second electrical elements. Next, a new conductor path is formed by extruding a conductive resin material to the printed circuit board assembly between the lead of the first electrical element and the lead of the third electrical element utilizing an extrusion delivery system. The conductive resin is then cured, thereby, hardening and fixing the conductive resin and providing a conductive path between the first and the third electrical elements.

BRIEF DESCRIPTION OF THE DRAWINGS

The invention, together with further objects and advantages, may best be understood by reference to the following detailed description taken in conjunction with the single sheet of drawings included herewith of which like reference numerals identify like elements, and which.

DESCRIPTION OF THE PREFERRED EMBODIMENTS

The method of the present invention contemplates the use of a conductive resin compound delivered to the PCBA by an extrusion arrangement. There are currently conductive adhesive compounds known in the electronics industry, that are used to attach surface mounted integrated circuits to glass substrates or surface mount component leads to conductor pads on printed circuit boards. These silver-filled thixotropic resin pastes are modern substitutes for metal fixing mediums such as solder. They find advantage over solder in that they are curable to a hardened state by the application of light in the ultraviolet (UV) spectrum and/or by the application of low heat. Further, these conductive adhesive compounds do not require the use of corrosive solvents normally used in solder paste applications, and eliminate vapor phase or infrared solder reflow processing. One such conductive resin is the B-568 UV Curable Conductive Adhesive, manufactured by the Westinghouse Corporation. This particular compound presents a viscosity of 30,000–40,000 cps at 25° C. allowing it to be easily screen printed on a substrate. An exposure to 345 millijoules/cm$^2$ of UV light for 10 seconds at a temperature of 40° C., or room temperature, will cause this conductive adhesive to cure. It adheres 100% to copper, aluminum and glass and exhibits stable resistivity over long periods of time.

The conductive resin compound described above with suitable rheological properties would allow it to be easily delivered between intended connection points as a fine and uniform thickness extrusion. One type of extrusion device contemplated by the method of the present invention would be the use of a hand-held syringe. The syringe filled with the conductive resin could easily apply the compound in a fine continuous tubular extrusion between the intended connection points. In this manner, a conductive semi-liquid conductor can be laid down on the PCBA between two connection points. Once cured, an electrical connection is formed which in a single operation connects the circuit elements and is fixed to the PCBA.

Still another method of delivering the conductive resin would be the use of a computer controlled extrusion system. Such a system under control of a programmable computer controller, could evenly and accurately apply the conductive resin quickly between the intended connection points. Another advantage of the computer controlled extrusion method is in the repeat applications of rework conductors to a plurality of PCBAs. By programming the computer controller of such an automated extrusion system conductive resin traces can be accurately and rapidly applied to either a single or a plurality of reworked PCBAs. Further, such an extrusion system can be designed to deliver the conductive resin as a fine tubular extrusion, a fine rectangular layer extrusion, or any extrusion form dictated by space or connection requirements.

Figure 1:
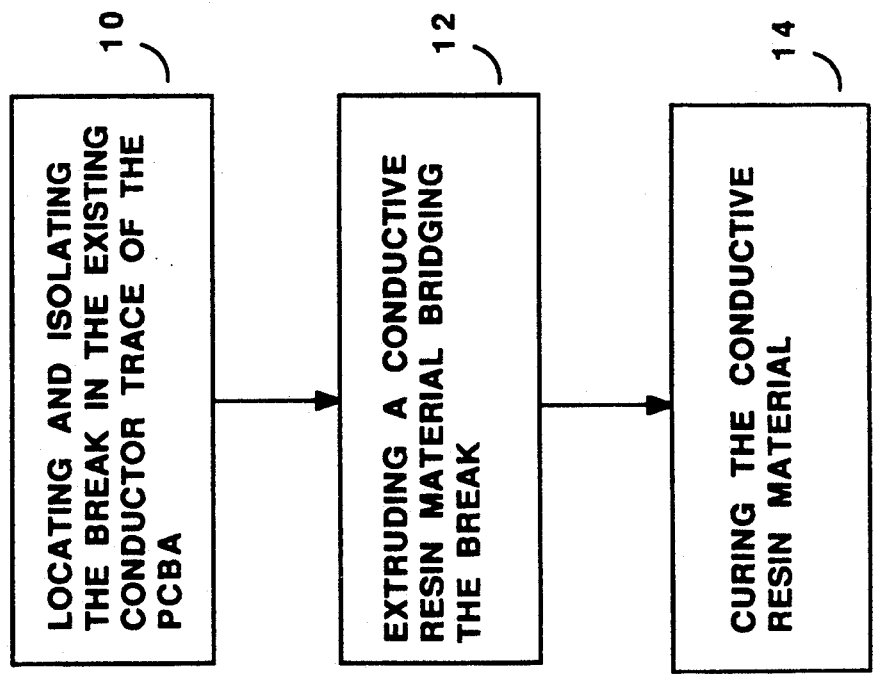
FIG. 1 is a diagram of the steps embodied in the repair of a PCBA having a faulty conductor trace in accordance with the method of the present invention.

Turning now to the included drawings the method for reconstructing the conductor traces of a PCBA in accordance with the present invention is illustrated. In FIG. 1 a first method of repairing a PCBA having a faulty conductor trace is shown. First the faulty conductive trace is located and the break in the conductor isolated (10). Then an extrusion of the conductive resin is applied across the break (12). The conductive resin can be extruded manually by hand, such as with a hand-held syringe, or applied mechanically by a computer controlled extrusion system. Once the extrusion is distributed across the break, electrically bridging the conductor trace, then the conductive resin is subjected to UV light to cure and fix the compound (14).

Figure 2:
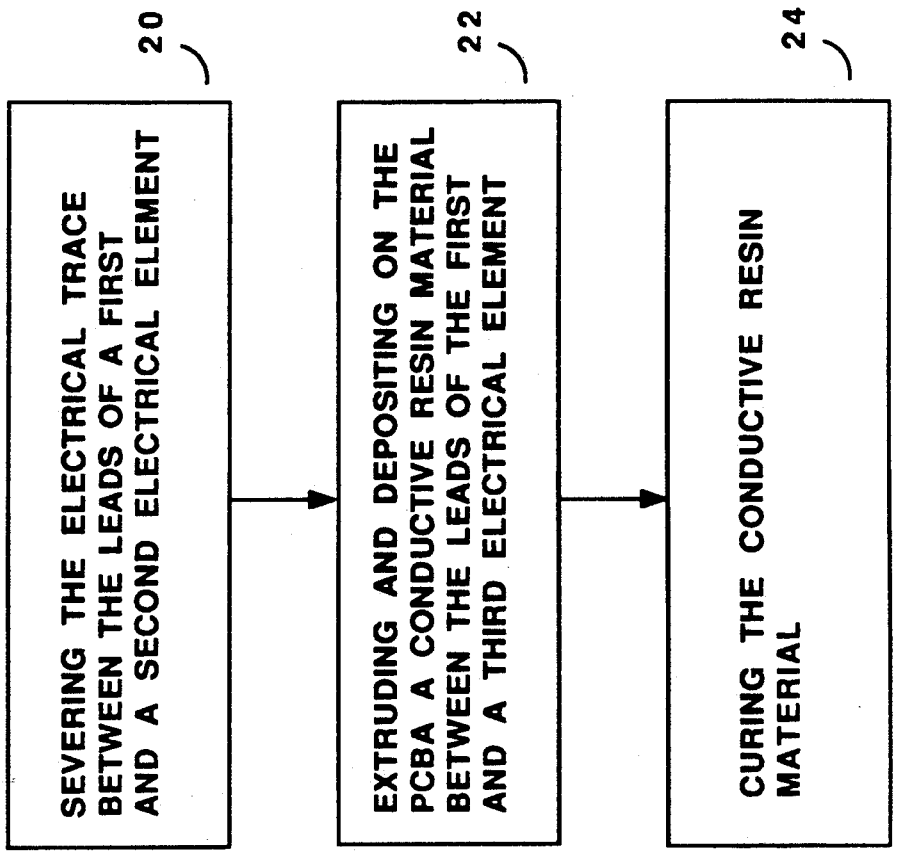
FIG. 2 is a diagram of the steps embodied in the rework of a conductor trace, in accordance with the method of the present invention.

In FIG. 2 a second method for reworking a conductor trace is illustrated. In this method a new conductive path is laid between electrical elements that are mounted on the PCBA. First the old electrical path from a first electrical element to a second electrical element is severed (20). This would normally be accomplished by cutting the existing conductor trace connecting the first and second electrical elements. Then a new conductor trace is extruded between the lead of the first electrical element and the lead of a third electrical element (22). The conductive resin is applied by hand-held syringe or by the computer controlled extrusion system. In instances were the extrusion must be applied over a long distance, such as when connecting across the length of the PCBA, the computer controlled extrusion system would be the recommended method of application. The computer controlled extrusion system would deliver an extrusion that is uniform and not reliant on the skill of the craftsperson to apply an extrusion of a consistent thickness and shape. Additionally, long conductor runs may require the extrusion to be formed around other electrical components or come in close proximity to other conductors on the PCBA, and therefore, the more exacting ability of machine delivery system would perform a higher quality result. Lastly, since many PCBAs are engineered to minimize electrical interference between adjacent conductors the computer controller could be programmed to layout the best path for the extruded resin conductor between the electrical elements, thereby, minimizing signal interference or conductive capacitance that may occur between the new conductive resin conductor and the existing conductors on the PCBA. The new conductive resin trace is then subjected to UV light to cure and fix the compound to the PCBA (24).

It will be appreciated that the novelty of the method of the present invention is in the combination of the UV curable conductive adhesive used with an extrusion system that allows the repair and/or rework of PCBAs, as well as the manufacture of PCBAs in small production runs in order to fabricate quick-turnaround prototype circuits.

Furthermore, it will be obvious to those skilled in the art that numerous modifications to the method of the present invention can be made without departing from the scope of the invention as defined by the appended claims.

What is claimed is:

1. A method for repairing the conductor traces of a printed circuit board assembly comprising the steps of:
    locating and isolating a break in the conductor trace of a printed circuit board assembly;
    applying a conductive thixotropic resin paste from a computer controlled extrusion system to said printed circuit board assembly bridging said break, said computer controlled extrusion system being programmable to deliver, under control of said computer, a continuous extrusion of said conductive thixotropic resin paste; and
    exposing said conductive thixotropic resin paste to light in the ultraviolet spectrum, thereby, hardening and fixing said conductive thixotropic resin paste and providing a conductive path across said break.

2. A method for reworking the conductor traces of a printed circuit board assembly, said printed circuit board assembly including at least first, second and third electrical elements and at least one conductor trace extending from a lead of said first electrical element to a lead of said second electrical element, said method comprising the steps of:
    severing the conductor trace extending between the leads of said first and said second electrical elements;
    applying a conductive thixotropic resin paste from a computer controlled extrusion system to said circuit board assembly between said lead of said first and a lead of said third electrical elements, said computer controlled extrusion system being programmable to deliver, under control of said computer, a continuous extrusion of said conductive thixotropic resin paste; and
    exposing said conductive thixotropic resin paste to light in the ultraviolet spectrum, thereby, hardening and fixing said conductive thixotropic resin paste and providing a conductive path between said first and said third electrical elements.

* * * * *